United States Patent
Chen et al.

(10) Patent No.: US 10,742,230 B2
(45) Date of Patent: Aug. 11, 2020

(54) CORRECTION METHOD AND CORRECTION CIRCUIT FOR SIGMA-DELTA MODULATOR

(71) Applicant: REALTEK SEMICONDUCTOR CORPORATION, Hsinchu (TW)

(72) Inventors: Chih-Lung Chen, Hsinchu County (TW); Jie-Fan Lai, Hsinchu (TW); Yu-Chang Chen, New Taipei (TW); Shih-Hsiung Huang, Miaoli County (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 16/519,739

(22) Filed: Jul. 23, 2019

(65) Prior Publication Data
US 2020/0091929 A1    Mar. 19, 2020

(30) Foreign Application Priority Data
Sep. 17, 2018    (TW) .............................. 107132670 A

(51) Int. Cl.
*H03M 1/06* (2006.01)
*H03M 3/00* (2006.01)

(52) U.S. Cl.
CPC ........... *H03M 3/368* (2013.01); *H03M 3/378* (2013.01); *H03M 3/422* (2013.01); *H03M 3/458* (2013.01); *H03M 1/06* (2013.01)

(58) Field of Classification Search
CPC ............ H03M 1/06; H03M 3/30; H03M 1/10; H03M 1/12; G11C 27/02
USPC .......................... 341/118, 143, 120, 122, 155
See application file for complete search history.

(56) References Cited

U.S. PATENT DOCUMENTS

2014/0266828 A1*  9/2014  Matsukawa .......... H03H 7/0138
341/143

FOREIGN PATENT DOCUMENTS

| WO | 2010025563 | 3/2010 |
| WO | 2013119945 | 8/2013 |

OTHER PUBLICATIONS

J. Roh et al. "A 0.9-V 60-μW 1-Bit Fourth-Order Delta-Sigma Modulator With 83-dB Dynamic Range," in IEEE Journal of Solid-State Circuits, vol. 43, No. 2, pp. 361-370, Feb. 2008. doi: 10.1109/JSSC.2007.914266.

Taiwan Intellectual Property Office, Office action issued in TW application No. 107132670 dated May 9, 2019. English summary on p. 1.

* cited by examiner

*Primary Examiner* — Joseph J Lauture
(74) *Attorney, Agent, or Firm* — WPAT, PC

(57) ABSTRACT

A correction method and a correction circuit for a sigma-delta modulator (SDM) are disclosed. The SDM includes a loop filter, a quantizer, and a digital-to-analog converter (DAC), and the loop filter includes a resonator. The correction circuit includes a memory and a control circuit. The memory stores multiple program instructions. The control circuit executes the program instructions to correct the SDM. The correction procedure of the SDM includes the following steps: inputting a test signal to the SDM; obtaining a signal characteristic value of an output signal of the SDM; and adjusting the resonator according to the signal characteristic value.

6 Claims, 4 Drawing Sheets

US 10,742,230 B2

CORRECTION METHOD AND CORRECTION CIRCUIT FOR SIGMA-DELTA MODULATOR

BACKGROUND

1. Field of the Disclosure

The present disclosure generally relates to sigma-delta modulators (SDMs), and, more particularly, to a correction method and a correction circuit for SDMs.

2. Description of Related Art

A sigma-delta modulator (SDM) can be used as an analog-to-digital converter (ADC). However, because the SDM is susceptible to manufacturing process, voltage and temperature (PVT), the ADC may suffer resolution degradation or even error. Therefore, a correction method and a correction circuit are needed to correct the SDM to ensure the efficiency and correctness of the SDM.

SUMMARY

In view of the issues of the prior art, an object of this disclosure is to provide a correction method and a correction circuit for a sigma-delta modulator (SDM) to make the SDM less susceptible to or free from negative influences of process, voltage and temperature (PVT).

A correction method for correcting an SDM is provided. The SDM includes a loop filter, a quantizer, and a digital-to-analog converter (DAC). The loop filter includes a resonator. The correction method includes the following steps: inputting a test signal to the SDM; obtaining a signal characteristic value of an output signal of the SDM; and adjusting the resonator according to the signal characteristic value.

A correction circuit for correcting an SDM is provided. The SDM includes a loop filter, a quantizer, and a DAC. The loop filter includes a resonator. The correction circuit includes a memory and a control circuit. The memory stores multiple program instructions. The control circuit is coupled to the memory and configured to execute the program instructions to correct the SDM by performing the following steps: inputting a test signal to the SDM; obtaining a signal characteristic value of an output signal of the SDM; and adjusting the resonator according to the signal characteristic value.

The correction method and correction circuit for the SDM of this disclosure can correct the SDM when the chip has just been manufactured, before the operation of the circuit, or during the operation of the circuit. Compared with the prior art, this disclosure can flexibly adjust the noise transfer function (NTF) of the SDM, so the SDM has a higher signal-to-noise ratio (SNR) or a lower error vector magnitude (EVM) and noise intensity in the frequency band of interest. Instant correction for the current operating environment can significantly reduce the negative impacts of the manufacturing process, voltage and temperature (PVT) on the SDM.

These and other objectives of this disclosure no doubt become obvious to those of ordinary skill in the art after reading the following detailed description of the preferred embodiments with reference to the various figures and drawings.

DETAILED DESCRIPTION OF THE EMBODIMENTS

The following description is written by referring to terms of this technical field. If any term is defined in this specification, such term should be explained accordingly. In addition, the connection between objects or events in the below-described embodiments can be direct or indirect provided that these embodiments are practicable under such connection. Said "indirect" means that an intermediate object or a physical space exists between the objects, or an intermediate event or a time interval exists between the events.

The disclosure herein includes a correction method and a correction circuit for a sigma-delta modulator (SDM) that make the SDM less susceptible to or free from negative influences of manufacturing process, voltage and temperature (PVT). On account of that some or all elements of the correction circuit for the SDM could be known, the detail of such elements is omitted provided that such detail has little to do with the features of this disclosure and this omission nowhere dissatisfies the specification and enablement requirements. Some or all of the processes of the correction method for the SDM may be implemented by software and/or firmware and can be performed by the correction circuit for the SDM or its equivalent. A person having ordinary skill in the art can choose components or steps equivalent to those described in this specification to carry out this disclosure, which means that the scope of this disclosure is not limited to the embodiments in the specification.

Figure 1:
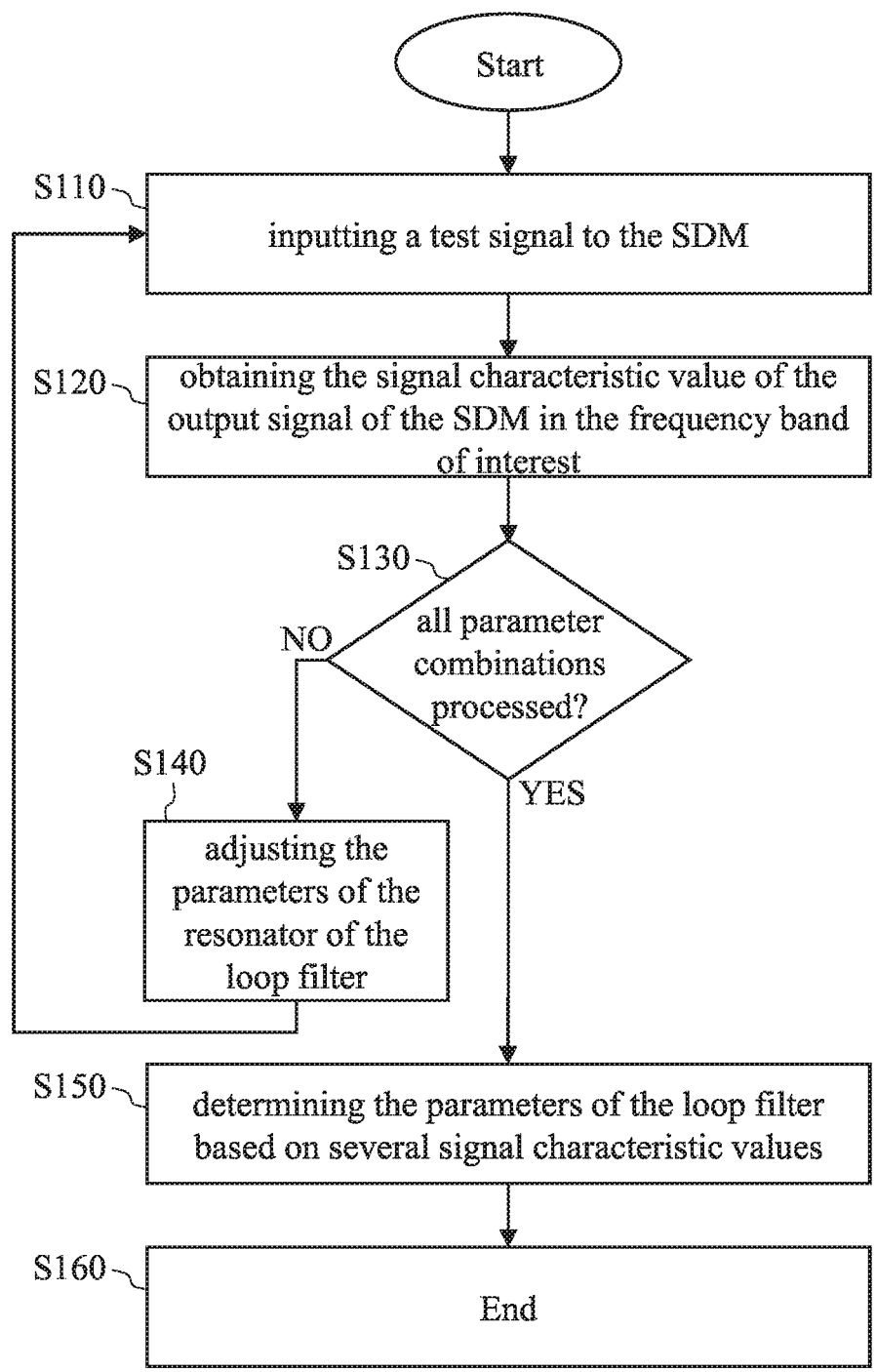
FIG. 1 is a flow chart of a method of correcting a sigma-delta modulator (SDM) according to an embodiment of this disclosure.
Figure 2:
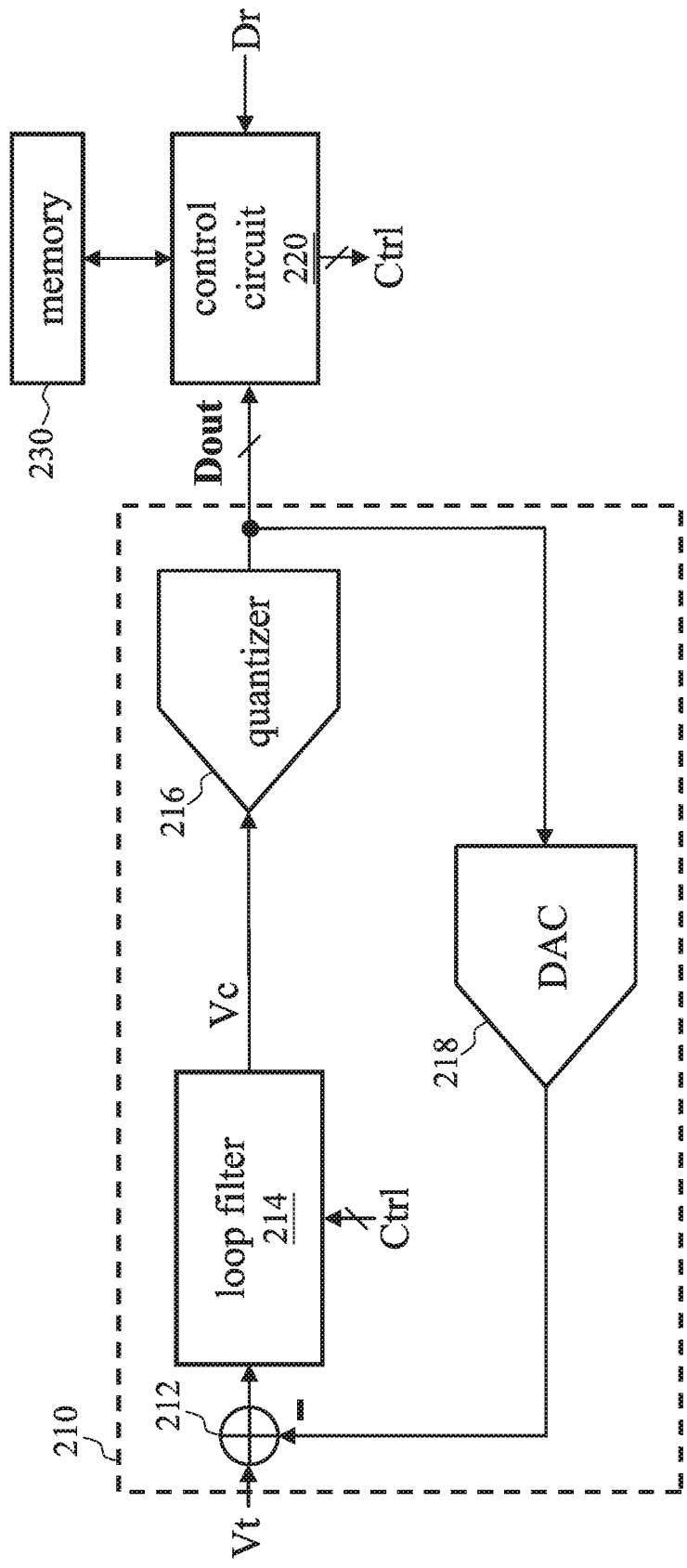
FIG. 2 is a functional block diagram of a correction circuit for an SDM according to an embodiment of this disclosure.

FIG. 1 is a flow chart of a method of correcting an SDM according to an embodiment of this disclosure, and FIG. 2 is a functional block diagram of a correction circuit for correcting an SDM according to an embodiment of this disclosure. The correction circuit includes a control circuit 220 and a memory 230. The control circuit 220 can be a circuit that is capable of executing program codes or program instructions, such as a central processing unit (CPU), a microcontroller, a microprocessor, a digital signal processor (DSP), and the like. The memory 230 stores a plurality of program codes or program instructions, and the control circuit 220 executes the program codes or program instructions to correct the SDM 210. The SDM 210 includes an adder circuit 212, a loop filter 214, a quantizer 216, and a digital-to-analog converter (DAC) 218. The operation principles of the SDM 210 are well known to people having ordinary skill in the art and are omitted for brevity. Reference is made to FIGS. 1 and 2 for the following description.

When the correction starts, the test signal Vt is inputted to the SDM 210 (step S110). The test signal Vt can be, for example, a tone signal (or single tone signal) or a signal received by the SDM 210 during its normal operation. In other words, the test method of this disclosure can be performed before the SDM 210 is in operation, or when the SDM 210 is in operation.

Next, the control circuit 220 obtains the signal characteristic value of the output signal Dout of the SDM 210 in the frequency band of interest (step S120). The frequency band of interest may be preset, such as the operating frequency band of the SDM 210. The signal characteristic value may be a signal-to-noise ratio (SNR), an error vector magnitude (EVM), or noise intensity of the output signal Dout. In some embodiments, the SNR, the EVM, and the noise intensity can be respectively measured by the SNR meter, the EVM meter, and the noise estimator in the chip in which the SDM 210 is fabricated or implemented, and the control circuit 220 receives the signal characteristic value (denoted by the signal Dr in the figure) from the meter or estimator. In some embodiments, the control circuit 220 is able to perform fast Fourier transform (FFT), and the control circuit 220 can perform the FFT operation on the output signal Dout and calculate the signal characteristic value of the output signal Dout based on the FFT results. Calculating the SNR, EVM, or noise intensity of the signal based on the FFT results of the signal is well known to people having ordinary skill in the art and is omitted for brevity. The control circuit 220 can store the signal characteristic value in its own memory circuit (such as a register) or store it in the memory 230. The obtained signal characteristic value corresponds to the current parameter combination of the loop filter 214, and the parameter combination of the loop filter 214 is described in the following paragraph by referring to FIGS. 3 and 4.

Figure 3:
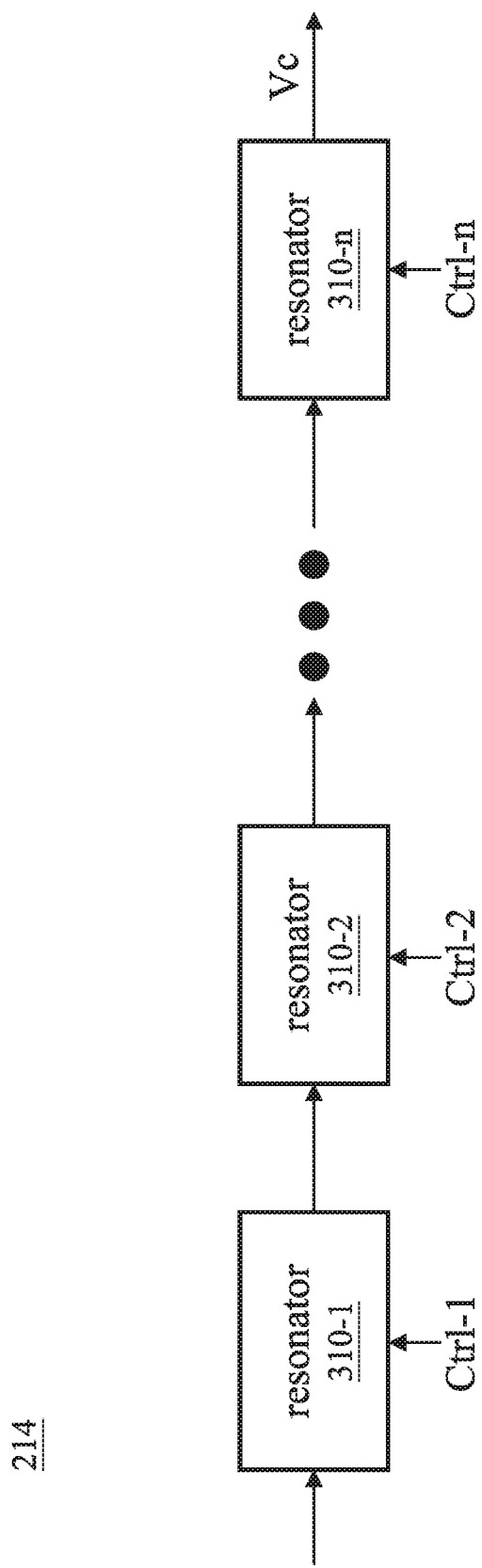
FIG. 3 is a circuit diagram of a loop filter according to an embodiment of this disclosure.
Figure 4:
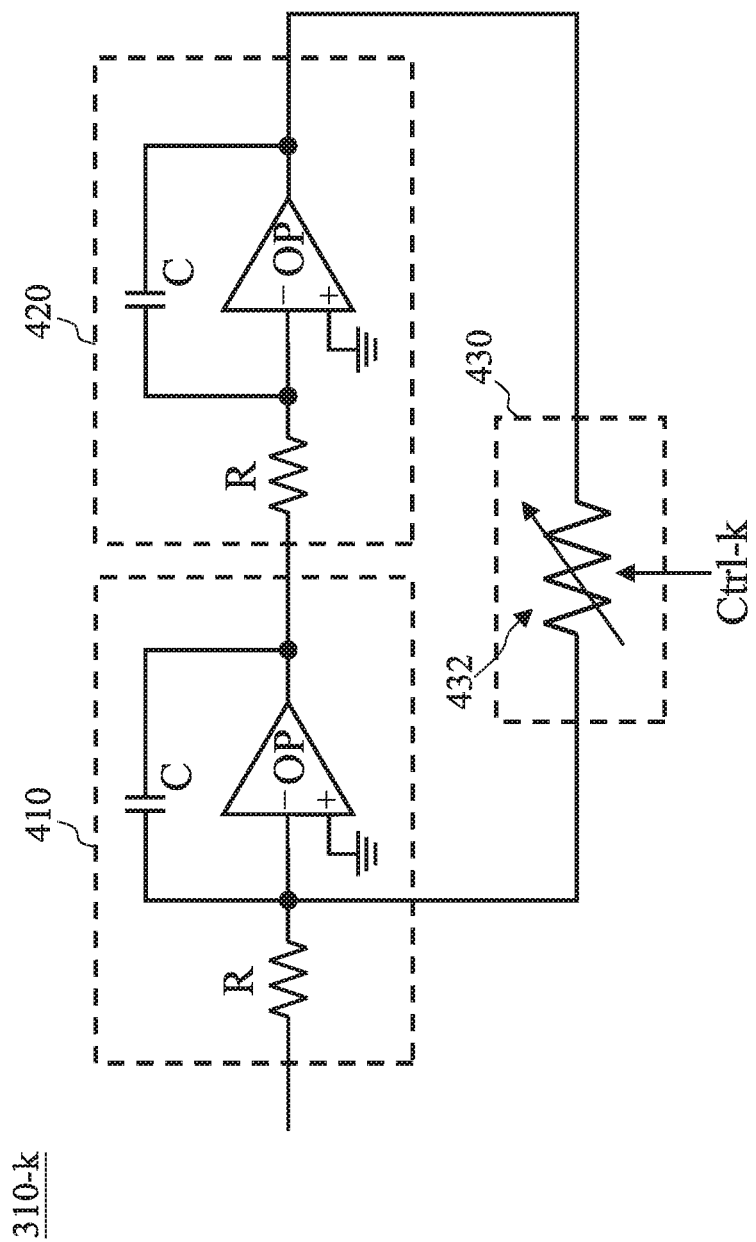
FIG. 4 is an internal circuit diagram of one of the resonators in FIG. 3.

FIG. 3 is a circuit diagram of the loop filter 214 according to an embodiment of this disclosure. The loop filter 214 includes n resonators 310 (310-1, 310-2, . . . , and 310-*n*, n being a positive integer) that are connected in series. The n resonators 310 are respectively controlled by n control signals (Ctrl-1, Ctrl-2, . . . Ctrl-n, collectively, the control signal Ctrl in FIG. 2). FIG. 4 shows an internal circuit of one of the resonators 310 in FIG. 3. The resonator 310-*k* (1≤k≤n) includes an integrator 410, an integrator 420, and an impedance 430. Each of the integrator 410 and the integrator 420 includes a resistor R, a capacitor C, and an operational amplifier OP. The connections among these components are shown in FIG. 4. The operation principles of the integrator 410 and the integrator 420 are well known to people having ordinary skill in the art and are omitted for brevity. The impedance 430 is located on the feedback path of the resonator 310-*k*. One end of the impedance 430 is coupled to the output of the operational amplifier OP of the integrator 420, and the other end of the impedance 430 is coupled to one of the inputs of the operational amplifier OP of the integrator 410. In some embodiments, the impedance 430 includes a variable resistor 432 whose resistance value is controlled by the control signal Ctrl-k. In other embodiments, the impedance 430 may contain at least one of a resistor, a capacitor, and an inductor, and at least one of the resistor, the capacitor, and the inductor is adjustable. If the variable resistors 432 of the resonators 310 in FIG. 3 each have five resistance values to be chosen, the loop filter 214 has $5^n$ parameter combinations. In some embodiments, some resonators 310 of the loop filter 214 are adjustable while others are not. In some embodiments, the control circuit 220 uses an exhaustive method to enumerate all parameter combinations, but this disclosure is not limited to the exhaustive method. The following descriptions use the exhaustive method as an example.

Reference is made again to FIG. 1. Next, the control circuit 220 determines whether all parameter combinations of the loop filter 214 have been processed (step S130). If NO, the flow proceeds to step S140; if YES, the flow proceeds to step S150.

When the determination result of the step S130 is NO, then in step S140, the control circuit 220 adjusts the resonators of the loop filter 214 by selecting a parameter combination which the resonators of the loop filter 214 have not used. After the adjustment, the control circuit 220 performs steps S110 to S130 again.

When the determination result of the step S130 is YES, the control circuit 220 has obtained the signal characteristic value for each parameter combination. Next, in step S150, the control circuit 220 determines the parameters of the loop filter 214 based on several signal characteristic values. More specifically, the control circuit 220 determines the parameters in different ways for different signal characteristic values. For the SNR, the control circuit 220 uses the parameter combination corresponding to the greatest SNR as the final parameter combination set for the loop filter 214. For the EVM and noise intensity, the control circuit 220 uses the parameter combination corresponding to the least EVM or noise intensity as the final parameter combination set for the loop filter 214. After the parameters of the loop filter 214 are determined, the control circuit 220 ends the correction process of the SDM 210 (step S160).

When the SDM 210 is so adversely affected by the manufacturing process, voltage and temperature (PVT) that it cannot operate according to its originally designed noise transfer function (NTF), the correction method and correction circuit of this disclosure can adjust the position(s) of the zero(s) of the NTF (e.g., shifting the zero(s) to the band of interest) by adjusting the resonator(s) of the loop filter 214, so as to create a notch in the band, thereby increasing the SNR in the band or decreasing the EVM and noise intensity in the band. In other words, despite the fact that the SDM 210 may be affected by PVT during practical operations, if the SDM 210 is corrected according to the flow of FIG. 1 when the chip is manufactured or each time before or when the SDM 210 is in operation, the corrected SDM 210 will perform better (i.e., having a better NTF) and overcome the negative impacts by PVT.

This disclosure provides corrections for different operation modes of the SDM 210. The operation modes of the SDM 210 includes, but not limited to, a combination of the following attributes: the sampling frequency, the bandwidth, and the oversampling ratio (OSR). For example, in some embodiments, when the sampling frequency and OSR are fixed, the control circuit 220 adjusts or optimizes the SDM 210 for different bandwidths (i.e., performing the correction process in FIG. 1 for different bandwidths); or, in other embodiments, when the sampling frequency is fixed, the control circuit 220 adjusts or optimizes the SDM 210 for various combinations of OSRs and bandwidths.

The correction method of this disclosure is an on-chip automatic correction process, which means that the circuit can, upon initialization or powered on, automatically correct the circuit for the current operating environment (temperature, voltage, etc.) and operation mode (sampling frequency, bandwidth, OSR, etc.). Therefore, the correction method has the advantage of the real-time correction. In addition, since many chips have the aforementioned SNR meter, EVM meter and noise estimator built-in, no additional hardware is required for the proposed correction method, which makes this disclosure easier to implement and more cost effective.

Since a person having ordinary skill in the art can appreciate the implementation detail and the modification thereto of the present method embodiment through the disclosure of the device embodiment, repeated and redundant description is thus omitted. Please note that there is no step sequence limitation for the method embodiments as long as the execution of each step is applicable. Furthermore, the shape, size, and ratio of any element and the step sequence of any flow chart in the disclosed figures are exemplary for understanding, not for limiting the scope of this disclosure.

The aforementioned descriptions represent merely the preferred embodiments of this disclosure, without any intention to limit the scope of this disclosure thereto. Various equivalent changes, alterations, or modifications based on the claims of this disclosure are all consequently viewed as being embraced by the scope of this disclosure.

What is claimed is:

1. A correction method for correcting a sigma-delta modulator (SDM), the SDM comprising a loop filter, a quantizer, and a digital-to-analog converter (DAC), the loop filter comprising a resonator, and the correction method comprising following steps:
    inputting a test signal to the SDM;
    obtaining a signal characteristic value of an output signal of the SDM, wherein the signal characteristic value is a signal-to-noise ratio (SNR), an error vector magnitude (EVM), or a noise intensity of the output signal; and
    adjusting the resonator according to the signal characteristic value.

2. The correction method of claim 1, wherein the resonator comprises a first integrator, a second integrator, and an impedance, and the step of adjusting the resonator according to the signal characteristic value adjusts the impedance.

3. The correction method of claim 1, wherein the step of obtaining the signal characteristic value of the output signal of the SDM obtains the signal characteristic value in an operating frequency band of the SDM.

4. A correction circuit for correcting a sigma-delta modulator (SDM), the SDM comprising a loop filter, a quantizer, and a digital-to-analog converter (DAC), the loop filter comprising a resonator, the correction circuit comprising:
    a memory configured to store a plurality of program instructions; and
    a control circuit coupled to the memory and configured to execute the program instructions to correct the SDM;
    wherein the control circuit corrects the SDM by performing following steps:
    inputting a test signal to the SDM;
    obtaining a signal characteristic value of an output signal of the SDM, wherein the signal characteristic value is a signal-to-noise ratio (SNR), an error vector magnitude (EVM), or a noise intensity of the output signal; and
    adjusting the resonator according to the signal characteristic value.

5. The correction circuit of claim 4, wherein the resonator comprises a first integrator, a second integrator, and an impedance, and the step of adjusting the resonator according to the signal characteristic value adjusts the impedance.

6. The correction circuit of claim 4, wherein the step of obtaining the signal characteristic value of the output signal of the SDM obtains the signal characteristic value in an operating frequency band of the SDM.

* * * * *